United States Patent [19]

Asano et al.

[11] Patent Number: 4,654,961

[45] Date of Patent: Apr. 7, 1987

[54] METHOD FOR PRODUCING SUPERCONDUCTING COIL

[75] Inventors: Katsuhiko Asano, Hitachi; Isao Kurita, Takahagi; Isamu Kamishita, Hitachi, all of Japan

[73] Assignee: Hitachi, Ltd., Tokyo, Japan

[21] Appl. No.: 703,903

[22] Filed: Feb. 21, 1985

[30] Foreign Application Priority Data

Feb. 24, 1984 [JP] Japan .................................. 59-32422

[51] Int. Cl.$^4$ .............................................. H01L 39/29

[52] U.S. Cl. ............................................... 29/599

[58] Field of Search .................. 29/599, 605, 447, 446

[56] References Cited

FOREIGN PATENT DOCUMENTS 161001 12/1979 Japan ...................................... 29/599

OTHER PUBLICATIONS

"Feasibility Test of a Shrink-Fit Assembly of a Large-Diameter Superconducting Solenoid for a Colliding Beam Detector", by Minemura et al, 0167-5087/84 ©Elsevier Science Publishers B.V. (North Holland Physics Publishing Division), Sep. 19, 1983.

*Primary Examiner*—Howard N. Goldberg
*Assistant Examiner*—Carl J. Arbes
*Attorney, Agent, or Firm*—Antonelli, Terry & Wands

[57] ABSTRACT

In a superconductive coil having no bobbin in its inside, there is provided a method for producing a superconducting coil having a good cooling ability. The method is characterized in that the superconducting coil is formed around a bobbin, a support cylinder is fitted around the outer periphery of the bobbin and thereafter, the bobbin is removed apart from the coil. A desired prestress may be applied from the support cylinder to the outer periphery of the coil. Therefore, it is possible to improve a thermal conductance and prevent the coil from moving during the superconducting operation.

13 Claims, 8 Drawing Figures

METHOD FOR PRODUCING SUPERCONDUCTING COIL

BACKGROUND OF THE INVENTION

1. Field of the Invention

The present invention relates to a method for producing a superconducting coil, and more particularly, to a method for producing a superconducting coil having no support member in its inside, that is, a so-called inner-bobbinless coil.

Recently, in view of various usages of coils, there has been a demand for a so-called inner-bobbinless coil that has no support member in its inside as a superconducting coil.

For instance, in colliding beam experiments of elementary particles, a particle's energy is to be measured for the purpose of specifying a new particle produced by collision of particles at an outside of a large size solenoid coil which is used as a target against which the particles collide. For this reason, it is necessary that the reduction amount of the new particle's energy reduction be minimized. It is therefore necessary that a thickness of a substance such as a coil through which the new particle passes be at a minimum. Accordingly, an inner-bobbinless coil that has no bobbin in its inside has been employed.

2. Description of the Prior Art

FIGS. 1 and 2 show a superconducting coil of the above-described inner-bobbinless type. In FIGS. 1 and 2, the superconducting coil 1 constitutes a coil which is produced winding by a predetermined number of turns of a conductive member whereby a superconducting member may be achieved. A support cylinder 2 supports the superconducting coil 1. In the coil of this type, as described above, it is necessary that the thickness of the part through which elementary particles pass be kept at a minimum and it is difficult to measure the energy of the particles. Therefore, it is impossible to apply a direct cooling method in which the coil is made to dip into liquefied helium contained in a container. Instead, an indirect cooling method is adopted in which a coil cooling tube 3, which serves as a flow passage for the liquefied helium, is provided in contact with an outer periphery of the support cylinder 2. In this way the coil is indirectly cooled through heat conduction by the liquefied helium flowing through the coil cooling tube 3.

Conventionally, there has been employed a method for producing such a coil as shown in FIG. 2. More specifically, in producing the superconducting coil 1 by winding the superconducting member, the superconducting coil 1 is arranged coaxially with and spaced at a predetermined interval apart from the support cylinder 2 supporting the coil. A resin or filler containing resin 4 is filled in the clearance therebetween so that the superconducting coil 1 is integrally formed with the support cylinder 2. Thus, the superconducting coil of the inner-bobbinless type is produced.

However, in the superconducting coil produced in accordance with the conventional method, there is a fear that the resin layer would be peeled off from the coil side or the support cylinder side upon curing of resin after the vacuum filling or upon the activation of the coil thereby decreasing the thermal conductance between the coil and the liquefied helium. This would be a problem in cooling ability of the coil. Furthermore, there is a fear that air would be mixed into the resin layer to remain as voids. This would also reduce the thermal conductance. Moreover, in case of a coil having a very large physical size such as a superconducting coil for experiments of elementary particles, it is necessary that in view of the workability of filling the resin, the clearance between the coil and the support cylinder be kept large to increase the thickness of the resin layer. The thermal conductance at the resin layer is low, which is a serious problem in cooling ability of the superconducting coil.

SUMMARY OF THE INVENTION

In view of the above-noted defects, an object of the present invention is to provide a method for producing an inner-bobbinless coil in order to avoid a reduction in thermal conductance between the coil and the support cylinder and to overcome the problems in cooling ability.

According to the present invention, a superconducting member is wound by a predetermined number of turns around an outer periphery of a substantially cylindrical bobbin, then a support cylinder is fitted around the outer periphery of the coil and thereafter, said bobbin is removed from the coil to achieve the above-noted object.

DESCRIPTION OF THE PREFERRED EMBODIMENTS

Figure 1:
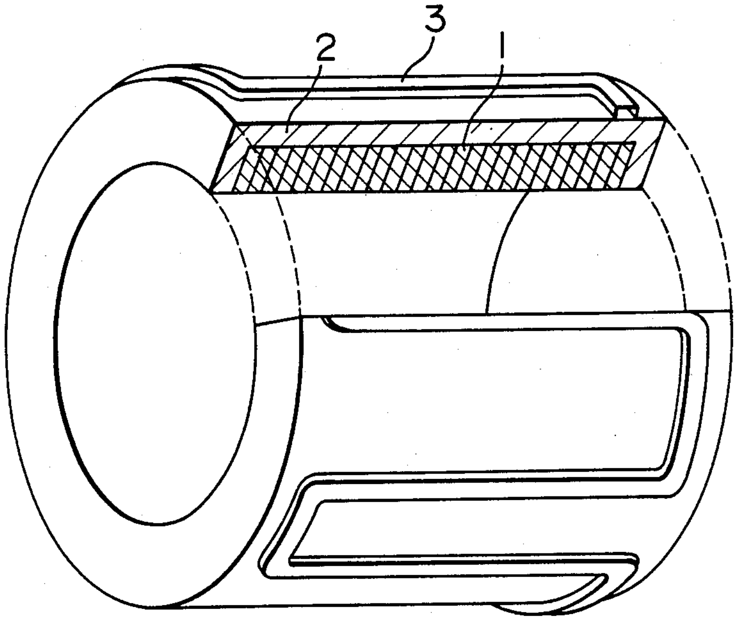
FIG. 1 PRIOR ART
FIG. 1 is a perspective view showing partially fragmentarily a conventional inner-bobbinless superconducting coil.
Figure 2:
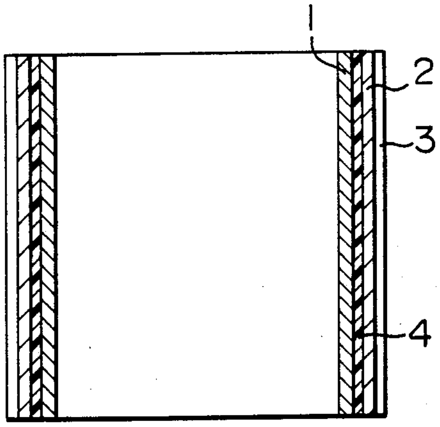
FIG. 2 PRIOR ART
FIG. 2 is a cross-sectional view illustrating a process for producing the conventional superconducting coil.

An embodiment of the invention will now be described with reference to FIGS. 3*a* to 3*e* and 4 in which the same reference numerals are used to designate the like components or members.

Figure 3A:
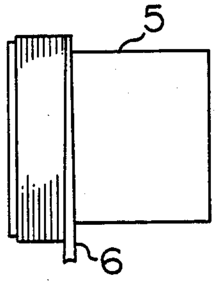
FIGS. 3*a* through 3*e* are views illustrating an embodiment of the invention showing a method for producing a superconducting coil.
Figure 3B:
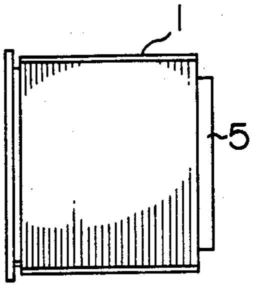
Figure 3C:
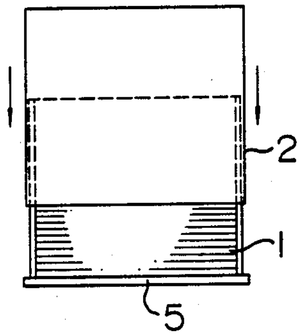

FIGS. 3*a* to 3*e* show the embodiment of the invention showing a process for producing a superconducting coil as described before. FIG. 3*a* shows a state in which a superconducting member 6 is wound around an outer periphery of a substantially cylindrical bobbin 5 with a suitable tension. FIG. 3*b* shows the superconducting coil 1 in which the winding has been completed by winding the superconducting member 6 by a predetermined number of turns through the condition shown in FIG. 3*a*. As shown in FIG. 3*c*, a support cylinder 2 is fitted around an outer periphery of the superconducting coil 1 whose winding has been completed. When the support cylinder 2 is brought into direct contact with the superconducting coil 1 during the fitting process, it is preferable that a prestress be always applied from the support cylinder 2 to the superconducting coil 1. The following is an example of a method for meeting this requirement. An inner diameter of the support cylinder 2 is machined so as to be smaller than an outer diameter of the superconducting coil 1. Then the support cylinder 2 is heated or the superconducting coil 1 is cooled so that the temperature of the support cylinder 2 is higher than the temperature of the superconducting coil 1.

Then the support cylinder 2 is fitted onto the outer periphery of the superconducting coil 1, and when the temperatures of the two components become the same, the prestress is applied from the support cylinder 2 to the superconducting coil 1. Also, in order to facilitate the fitting operation of the superconducting coil 1 and the support cylinder 2, it is possible to apply a material to at least one of the outer periphery of the superconducting coil 1 and the inner periphery of the support cylinder 2. As such a preprocess, there is a method of applying lubricants on the outer peripheries of the components. Furthermore, it is preferable that the prestress be applied uniformly from the support cylinder 2 to the outer periphery of the superconducting coil 1 and in order to prevent the reduction in thermal conductance, it is possible that the preprocess be applied to the superconducting coil 1. As such a preprocess, there is a method in which a desired degree of true circle of the superconducting coil 1 is ensured to thereby increase the contact area with the support cylinder 2 after assembling. In order to enhance the degree of true circle of the superconducting coil 1 to a desired extent, for example, a method is provided in which a metal film having an accurate surface is formed on the outer periphery of the superconducting coil 1.

Figure 3D:
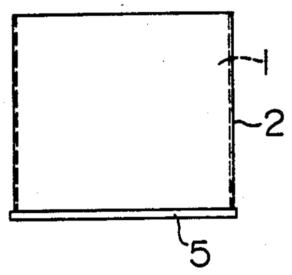
Figure 3E:
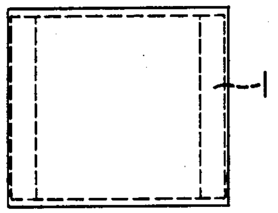

FIG. 3*d* shows the thus assembled superconducting coil 1. After the support cylinder 2 is fitted around the superconducting coil 1, the bobbin 5 is removed from the coil 1 so that the inner-bobbinless coil 1 having no bobbin 5 is finally obtained as shown in FIG. 3*e*.

Figure 4:
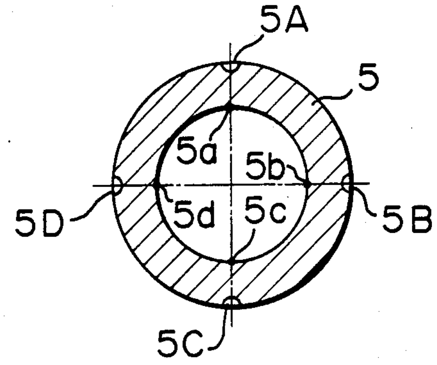
FIG. 4 is a cross-sectional view of the bobbin used in FIGS. 3*a* through 3*e*.

As an example of a method in which the bobbin 5 is removed from the coil 1 which has been made of the wound superconducting member and around which the support cylinder 2 has been fitted, there is the following method as shown in FIG. 4. Namely, a plurality of shallow grooves 5A, 5B, 5C and 5D are formed in advance on the surface of the cylindrical bobbin 5 in parallel with a centerline of the bobbin 5. Then, a synthetic resin is filled in these grooves to smooth the surface of the bobbin 5. The superconducting member is wound onto the surface and the support cylinder 2 is provided therearound. Thereafter, the bobbin 5 is severed radially from the respective points 5*a*, 5*b*, 5*c* and 5*d* of the inner surface of the bobbin 5 toward the respective grooves 5A, 5B, 5C and 5D. The severing reaches the bottom of each groove to thereby cut the bobbin so that the bobbin 5 may be removed without any damage in the superconducting coil.

Through the above-described process, as the bobbin 5 is cut and removed, the superconducting coil 1 will shrink radially inwardly due to residual stress caused by the coil tension residing in the superconducting coil 1. However, such a problem may readily be solved by selecting the prestress caused in the superconducting coil 1 during the process shown in FIG. 3*c*, in advance in view of such a residual stress.

With such a method for producing the superconducting coil in accordance with the embodiment of the invention, there is no fear that the coil would be peeled apart from the support cylinder during the cooling-/heating cycle in the operation. At the same time, a desired thermal conductance may be obtained without any gap such as voids between the superconducting coil and the support cylinder. Furthermore, a desired prestress may be applied to the superconducting coil. Since there is no gap or clearance between the superconducting coil and the support cylinder, the movement of the superconducting coil due to electromagnetic force or the like may be prevented to thereby ensure a desired stability of the superconducting coil. Also, the above-described preprocess facilitates the fabricating work of the superconducting coil and the support cylinder and makes it possible to apply a uniform prestress to the coil with an advantage that the thermal conductance is not decreased. The application of the method according to the invention is not limited in, for example, a physical size of the coil. Thus, various applications are possible.

In the embodiment as shown above, the pretreatment with lubricants is used as a method for treating the outer surface of the superconducting coil or the inner surface of the support cylinder, and the application of metal layers or the like is used as a method for pretreating the outer surface of the superconducting coil 1. However, it is apparent that the present invention is not limited to such specific method but various modifications and changes are possible for those skilled in the art.

As described above, in accordance with the method for producing the superconducting coil, a coil is formed by winding the superconducting member a predetermined number of turns around the outside of the substantially cylindrical bobbin, thereafter, the support cylinder is fitted around the outer periphery of the coil and then, the bobbin is removed from the coil. Therefore, there is no problem in thermal conductance between the coil and the support cylinder and it is possible to obtain such a superconducting coil free from any problem in cooling ability.

We claim:

1. A method for producing a superconducting coil, comprising the following steps of:
   - providing a substantially cylindrical bobbin having inner and outer surfaces, said substantially cylindrical bobbin having a plurality of shallow grooves in the outer surface thereof;
   - forming a coil by winding a superconducting member by a predetermined number of turns around the outer surface of said substantially cylindrical bobbin;
   - thereafter fitting a support cylinder around an outer periphery of said coil;
   - thereafter severing said substantially cylindrical bobbin from the inner surface toward the plurality of grooves; and
   - further thereafter removing said substantially cylindrical bobbin apart from said coil.

2. A method for producing a superconducting coil, comprising the steps of:
   - forming a coil by winding a superconducting member by a predetermined member of turns around an outer periphery of a substantially cylindrical bobbin;
   - machining a support cylinder so that an inner diameter of said support cylinder is smaller than an outer diameter of said coil when said support cylinder and said coil are at the same temperature;
   - generating a temperature difference between said support cylinder and said coil by cooling said coil such that the outer diameter of said support cylinder is greater than the inner diameter of said coil;
   - thereafter fitting said support cylinder around an outer periphery of said coil, whereby a prestress is applied from said support cylinder to said coil when the temperatures of said support cylinder and said coil become the same; and
   - further thereafter removing said substantially cylindrical bobbin apart from said coil.

3. The method according to claim 2, wherein a treatment with lubricants is applied to at least one of the outer periphery of said coil and the inner periphery of said support cylinder.

4. The method according to claim 2, wherein a metal film is formed on the outer periphery of said coil.

5. The method according to claim 2, wherein a plurality of shallow grooves are in advance formed in a surface of said substantially cylindrical bobbin around which said superconducting member is wound, and a resin is filled in said grooves to form smooth surfaces to form said coil, and thereafter, said bobbin is severed from the inner surface of said bobbin toward said grooves to thereby remove the bobbin apart from the coil.

6. The method according to claim 3, wherein a plurality of shallow grooves are in advance formed in a surface of said substantially cylindrical bobbin around which said superconducting member is wound, and a resin is filled in said grooves to form smooth surfaces to form said coil, and thereafter, said bobbin is severed from the inner surface of said bobbin toward said grooves to thereby remove the bobbin apart from the coil.

7. The method according to claim 4, wherein a plurality of shallow grooves are in advance formed in a surface of said substantially cylindrical bobbin around which said superconducting member is wound, and a resin is filled in said grooves to form smooth surfaces to form said coil, and thereafter, said bobbin is severed from the inner surface of said bobbin toward said grooves to thereby remove the bobbin apart from the coil.

8. The method according to claim 1, wherein a treatment with lubricants is applied to at least one of the outer periphery of said coil and the inner periphery of said support cylinder.

9. The method according to claim 1, wherein a metal film is formed on the outer periphery of said coil.

10. The method according to claim 1, wherein said plurality of grooves in the outer surface of said substantially cylindrical bobbin are filled with a resin to form a smooth outer surface around which said superconducting member is wound.

11. The method according to claim 10, wherein said plurality of shallow grooves are parallel to a centerline of said substantially cylindrical bobbin.

12. The method according to claim 1, wherein said support cylinder is formed so that an inner diameter of said support cylinder is smaller than an outer diameter of said coil when said support cylinder and said coil are at the same temperature and said support cylinder is fitted around the outer periphery of said coil by generating a temperature difference between said support cylinder and said coil such that the outer diameter of said support cylinder is greater than the inner diameter of said coil, whereby prestress is applied from said support cylinder to said coil when the temperatures of said support cylinder and said coil become the same.

13. The method according to claim 2, wherein the support cylinder is fitted to the coil so as to directly contact the coil.

* * * * *